(12) United States Patent
Zhang et al.

(10) Patent No.: US 11,057,058 B2
(45) Date of Patent: Jul. 6, 2021

(54) QUALITY OF SERVICE OF AN ADAPTIVE SOFT DECODER

(71) Applicant: SK hynix Inc., Icheon-Si (KR)

(72) Inventors: Fan Zhang, San Jose, CA (US); Chenrong Xiong, San Jose, CA (US); Xuanxuan Lu, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 16 days.

(21) Appl. No.: 16/568,053

(22) Filed: Sep. 11, 2019

(65) Prior Publication Data

US 2021/0075446 A1 Mar. 11, 2021

(51) Int. Cl.
*H03M 13/35* (2006.01)
*H03M 13/45* (2006.01)
*G06F 11/10* (2006.01)

(52) U.S. Cl.
CPC ....... *H03M 13/353* (2013.01); *G06F 11/1068* (2013.01); *H03M 13/45* (2013.01)

(58) Field of Classification Search
CPC .................................................. H03M 13/353
USPC ........................................................ 714/764
See application file for complete search history.

(56) References Cited

U.S. PATENT DOCUMENTS

| | | | |
|---|---|---|---|
| 7,685,494 B1 | 3/2010 | Varnica et al. | |
| 8,654,603 B2 * | 2/2014 | Tak | G11C 29/16 365/233.13 |
| 9,513,982 B1 * | 12/2016 | Wu | G06F 11/073 |
| 2004/0062123 A1 * | 4/2004 | Yumoto | G11C 29/46 365/222 |
| 2010/0199149 A1 * | 8/2010 | Weingarten | G06F 11/1068 714/773 |
| 2017/0236592 A1 * | 8/2017 | Alhussien | G11C 16/3431 714/721 |
| 2020/0067789 A1 * | 2/2020 | Khuti | G06F 16/88 |

OTHER PUBLICATIONS

Using Machine Learning to Enhance Flash Endurance & Latency, Flash Memory Summit, Santa Clara, CA, 2017.

* cited by examiner

*Primary Examiner* — Fritz Alphonse
(74) *Attorney, Agent, or Firm* — Perkins Coie LLP

(57) ABSTRACT

Disclosed are devices, systems and methods for improving a quality of service of an adaptive soft decoder in a non-volatile memory device. An example method includes selecting, based on current operating conditions of the non-volatile memory device, a first decoder parameter set from an ordered plurality of decoder parameter sets, each decoder parameter set corresponding to a distinct operating condition of the non-volatile memory device and comprising parameters related to a soft decoding operation; performing, based on the first decoder parameter set, the soft decoding operation; upon a determination that the soft decoding operation has succeeded, reordering the ordered plurality of decoder parameter sets to place the first decoder parameter set at a start of the ordered plurality of decoder parameter sets, and otherwise, performing the soft decoding operation based on a second decoder parameter set selected from the ordered plurality of decoder parameter sets.

20 Claims, 8 Drawing Sheets

QUALITY OF SERVICE OF AN ADAPTIVE SOFT DECODER

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, the multi-level NAND flash devices can be inherently unreliable and generally need to use ECCs to allow dramatic increase in data reliability at the expense of extra storage space for ECC parity bits. There is a demand for ECCs that can provide data protection with increased quality of service (QoS).

SUMMARY

Embodiments of the disclosed technology relate to methods, devices and systems for improving the quality of service (QoS) of an adaptive soft decoder. The methods and devices described in the present document advantageously, among other features and benefits, enable improvement in QoS, which is a critical metric in enterprise storage systems.

In an example aspect, a method for improving a quality of service of a decoder in a non-volatile memory device includes selecting, based on current operating conditions of the non-volatile memory device, a first decoder parameter set from an ordered plurality of decoder parameter sets, each decoder parameter set corresponding to a distinct operating condition of the non-volatile memory device and comprising parameters related to a soft decoding operation; performing, based on the first decoder parameter set, the soft decoding operation; upon a determination that the soft decoding operation has succeeded, reordering the ordered plurality of decoder parameter sets to place the first decoder parameter set at a start of the ordered plurality of decoder parameter sets, and otherwise, performing the soft decoding operation based on a second decoder parameter set selected from the ordered plurality of decoder parameter sets.

In another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

An enterprise SSD (enterprise solid-state drive, also sometimes referred to as an enterprise solid-state disk) is a device that stores data persistently or caches data temporarily in nonvolatile semiconductor memory and is intended for use in storage systems, servers, and direct-attached storage (DAS) devices. Enterprise SSDs generally use NAND flash memory and deliver higher performance and consume less power than spinning hard-disk drives (HDDs).

Examples of advantages that an enterprise SSD may offer over a client or consumer SSD include higher performance, protection of DRAM-stored data in the event of a power loss, stronger error correction code (ECC), and consistent and persistent quality of service (QoS). An enterprise SSD also tends to provide a greater level of endurance than a client or consumer SSD.

FIGS. 1-6 overview a non-volatile memory system (e.g., an enterprise SSD) in which embodiments of the disclosed technology may be implemented.

Figure 1:
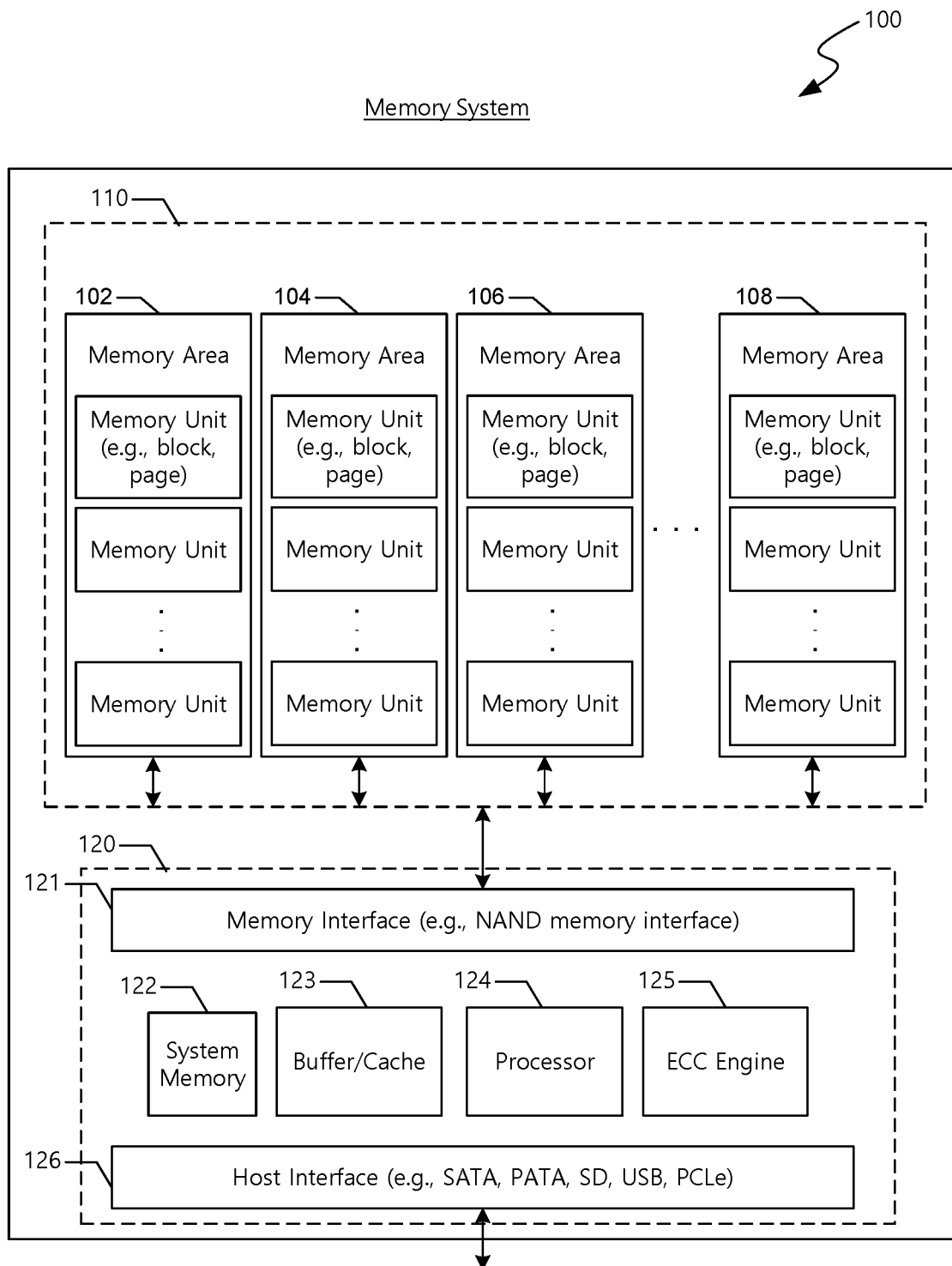
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
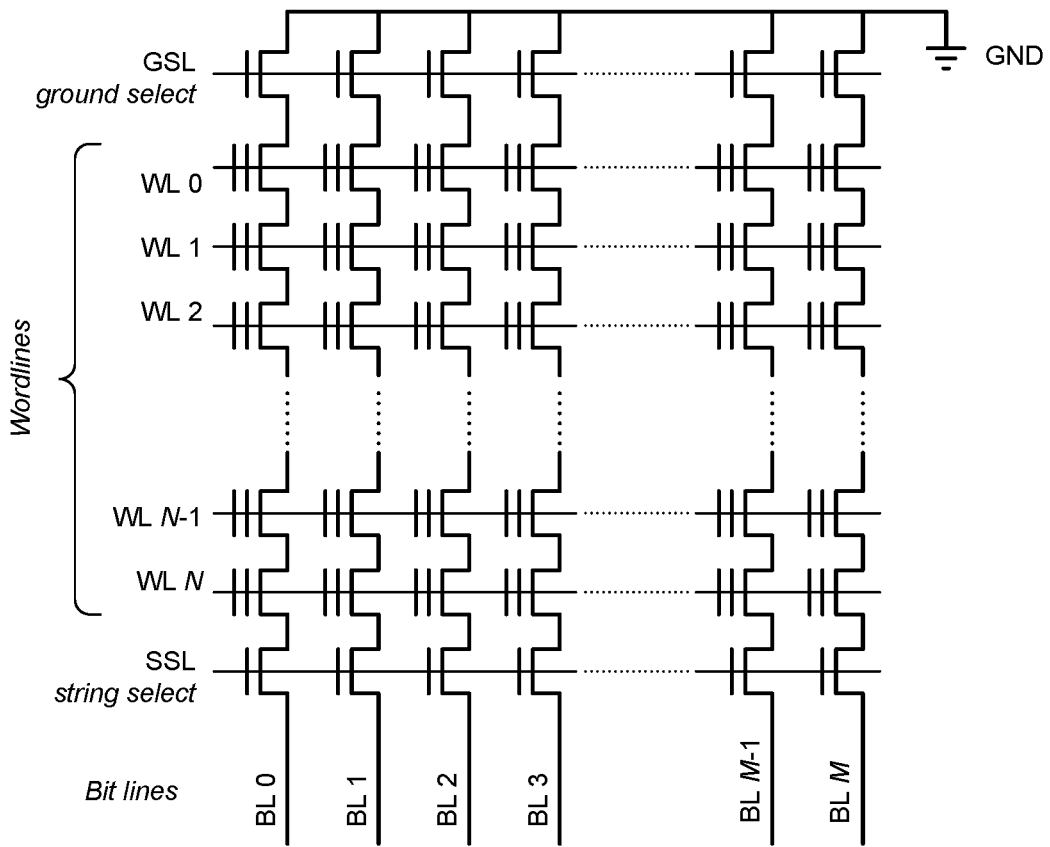
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
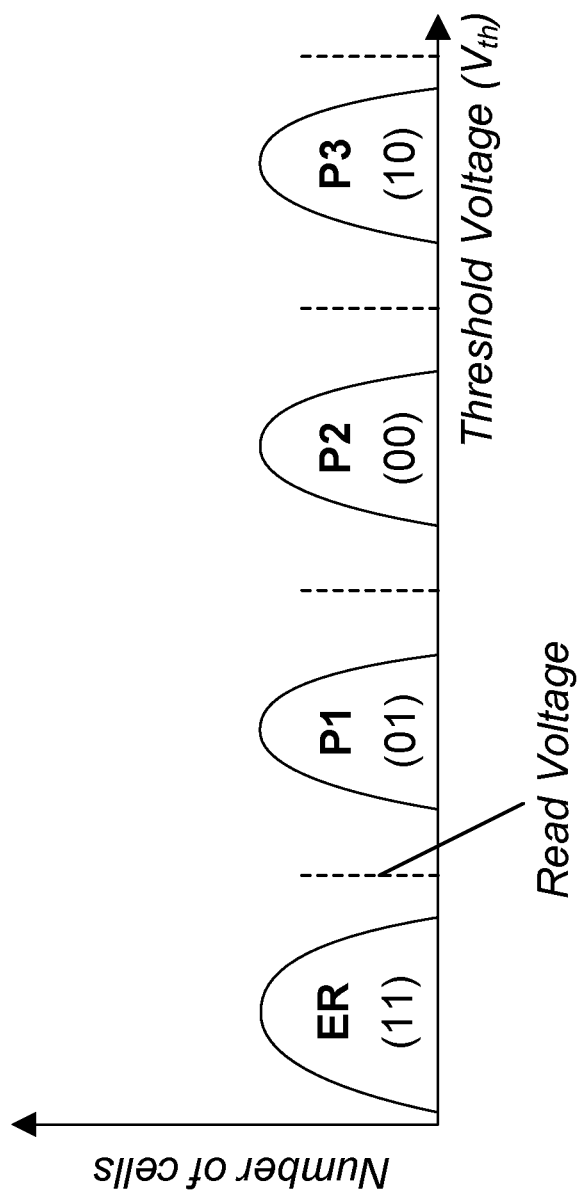
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
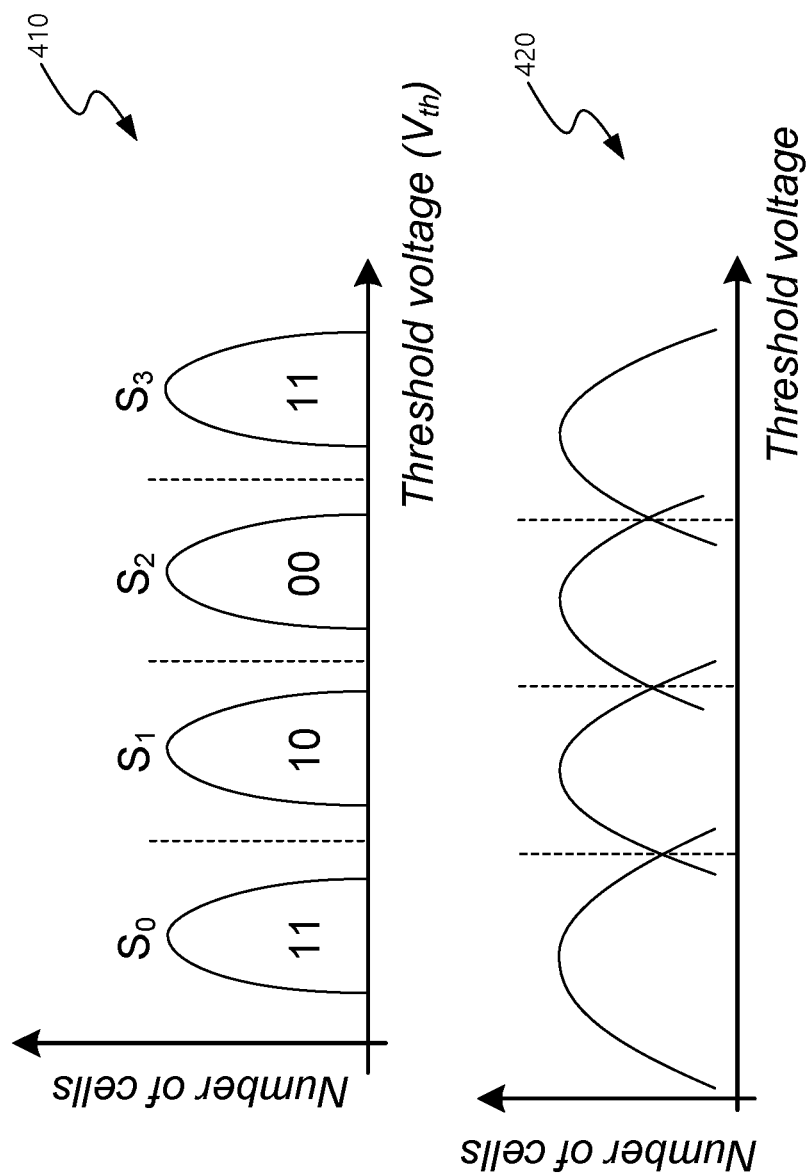
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to 2n possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
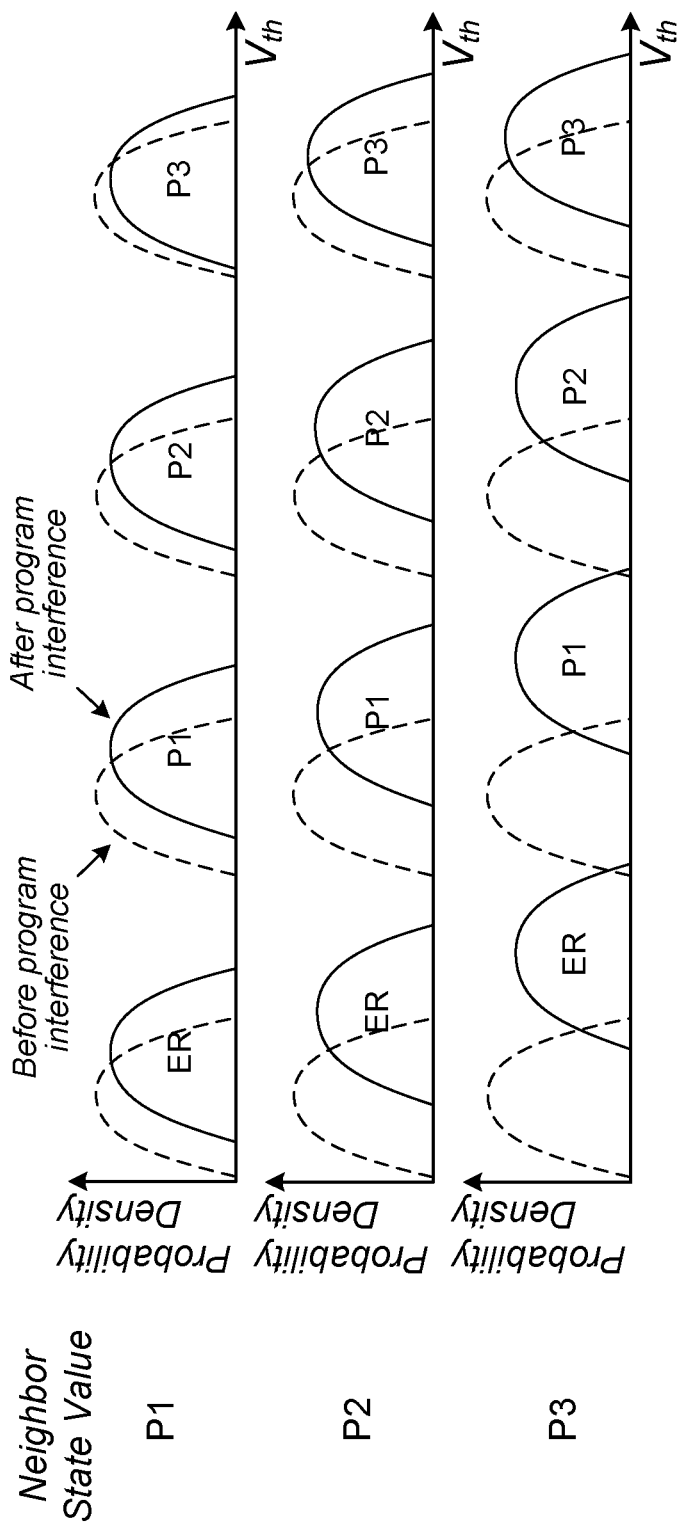
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell inference than even cells in the even/odd bit-line structure, and the all-bit-line structure can effectively support high-speed current sensing to improve the memory read and verify speed.

The dotted lines in FIG. 5 denote the nominal distributions of PIE states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
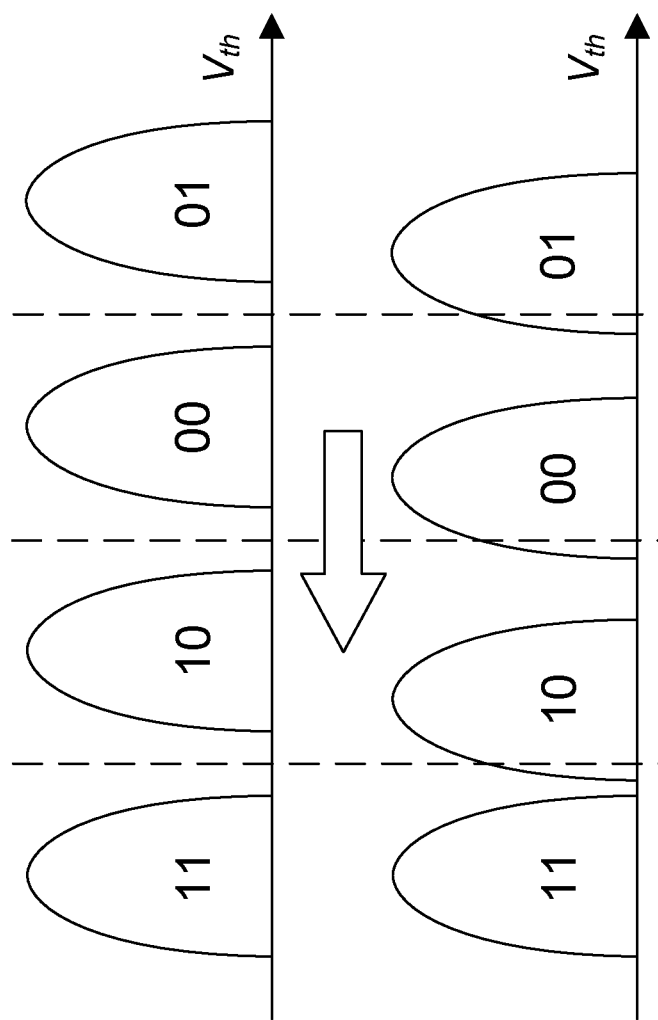
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In some embodiments, the ECC used in enterprise SSDs are low-density parity-check (LDPC) codes. LDPC codes, which provide robust error correction performance, are a family of linear block forward error-correction (ECC) code whose parity check matrix can be represented by a low-density parity-check matrix. LDPC decoder can either be a hard decoder (which uses bits in its internal computations) or a soft decoder (which uses reliability metrics, e.g., log-likelihood ratios in its internal computations).

Parameters of a soft LDPC decoder are highly dependent on NAND operating conditions such as program/erase (PE) cycles, retention and read disturbance (SPRD) of the data that the decoder is trying to decode. Existing implementations of soft decoders rely on a predetermined set of decoder parameters that is chosen based on the majority of the data the decoder is trying to decode so that the average performance is optimized. However, for enterprise storage, quality of service (QoS), instead of performance, often becomes the most critical metric. In an example, the QoS of an enterprise SSD refers to the consistency and predictability of latency (e.g., response time) and input/output operations per second (referred to as IOPS) performance while servicing a read/write workload.

In enterprise SSDs, the QoS is often the first specification violation at end-of-life (EOL). The long tail of the latency distribution is typically due to the increased probability of triggering soft reads and the soft decoding process. In some instances (e.g., based on drive measurements), the soft decoding latency can be up to a few milliseconds, and is primarily affected by the retry modes in the soft decoder.

In some embodiments, the soft decoder may be configured using a multitude of decoder parameters, e.g., alpha and beta scaling, iteration control, initial LLR, LLR dampening scaling factor and checksum thresholds. In this patent document, one set of these parameters is denoted as a parameter set, and soft decoders may be designed to use multiple different parameter sets (e.g., up to 16 different parameter sets), and may be arranged in a predefined order. Thus, if one parameter set fails to decode, the decoder will switch to a different parameter set and attempt to decode again. In an example, switching to a different parameter set may accrue a delay of 60 to 80 microseconds. In the worst case, the retry mode can take more than 1 millisecond to converge.

In some embodiments, the parameter values in each of the parameter sets and the predetermined order of the parameter sets is based on a model of the NAND device, e.g., an additive white Gaussian noise (AWGN) model. In other embodiments, an AWGN model may be modified based on data collected from candidate SSD drives.

The data collected from candidate SSD drives suggests:
(1) There is a significant variation in the noise model at different operating conditions (e.g., NAND conditions such as P/E cycles, retention and SPRD), and
(2) The ordering of the parameter sets depends on the operating conditions. In an example, the ordering may be based on the probability of successful decoding using each parameter set.

Embodiments of the disclosed technology improve the QoS of an adaptive soft decoder by applying different orderings of the decoder parameter sets based on the varying operating conditions of the underlying device (e.g., the enterprise SSD). The optimized ordering advantageously reduces the latency of the decoding operation.

In some embodiments, the operation of the adaptive soft decoder include an offline optimization and an online optimization.

Offline optimization. As discussed above, the operating conditions (denoted C) include P/E cycles (denoted PEC), retention (denoted RET) and SPRD near device end-of-life (denoted SPRD), and are represented as $C_i=[PEC_i, RET_i, SPRD_i]$. For each set of operating conditions, multiple decoder parameter sets (denoted P) are defined. An example ordering of the decoder parameter sets, for operating conditions $C_i$, is:

$$P(C_i)=[P_0(C_i), P_1(C_i), P_2(C_i), \ldots P_{14}(C_i), P_{15}(C_i)].$$

Herein, $P_j(C_i)$ represents the j-th decoder parameter set for operating conditions $C_i$.

Online optimization. During the soft decoding operation, once it is determined that the operating conditions are similar to $C_i$, the soft decoder will apply $P(C_i)$ to its retry modes as part of the decoding operations.

In an example, $P_j(C_i)$ is the decoder parameter set that is used by the soft decoder. If the decoding operation succeeds, the ordering of the decoder parameter sets is updated to $$P(C_i)=[P_j(C_i), P_0(C_i), P_1(C_i), \ldots, P_{j-1}(C_i), P_{j+1}(C_i), \ldots, P_{15}(C_i)].$$

On the other hand, if the decoding operation fails, then a different decoder parameter set $P_{k \neq j}(C_i)$ is used for the next run of the decoding operation. If all the entries of $P(C_i)$ result in a decoding failure, $P(C_i)$ is not updated, and an alternate error correction mechanism (e.g., a chipkill process) is implemented.

In addition to PEC, RET and SPRD, the operating conditions may further include the physical location. Data collected over a multitude of memory storage devices suggests that memory in the same area of the device (e.g., the enterprise SSD) has similar properties (or operating conditions, Ci). Thus, if a particular decoder parameter set for that set of operating conditions (e.g., $P_j(Ci)$) is successful in the decoding operation, it is moved to the front (or start) of the ordering, which enables its reuse and increases the likelihood of successful decoding since the adjacent memory location has similar operating conditions to the memory location that was just decoded. Thus, the reordering of the decoder parameter sets advantageously decreases the decoding latency and improves the QoS.

In some embodiments, the online optimization may be performed by either the firmware or the hardware. In the former case, the firmware tracks the ordering of the decoder sets and updates the ordering based on the decoder performance. In the latter case, the hardware controls the ordering and updating, and no firmware intervention is needed.

Figure 7:
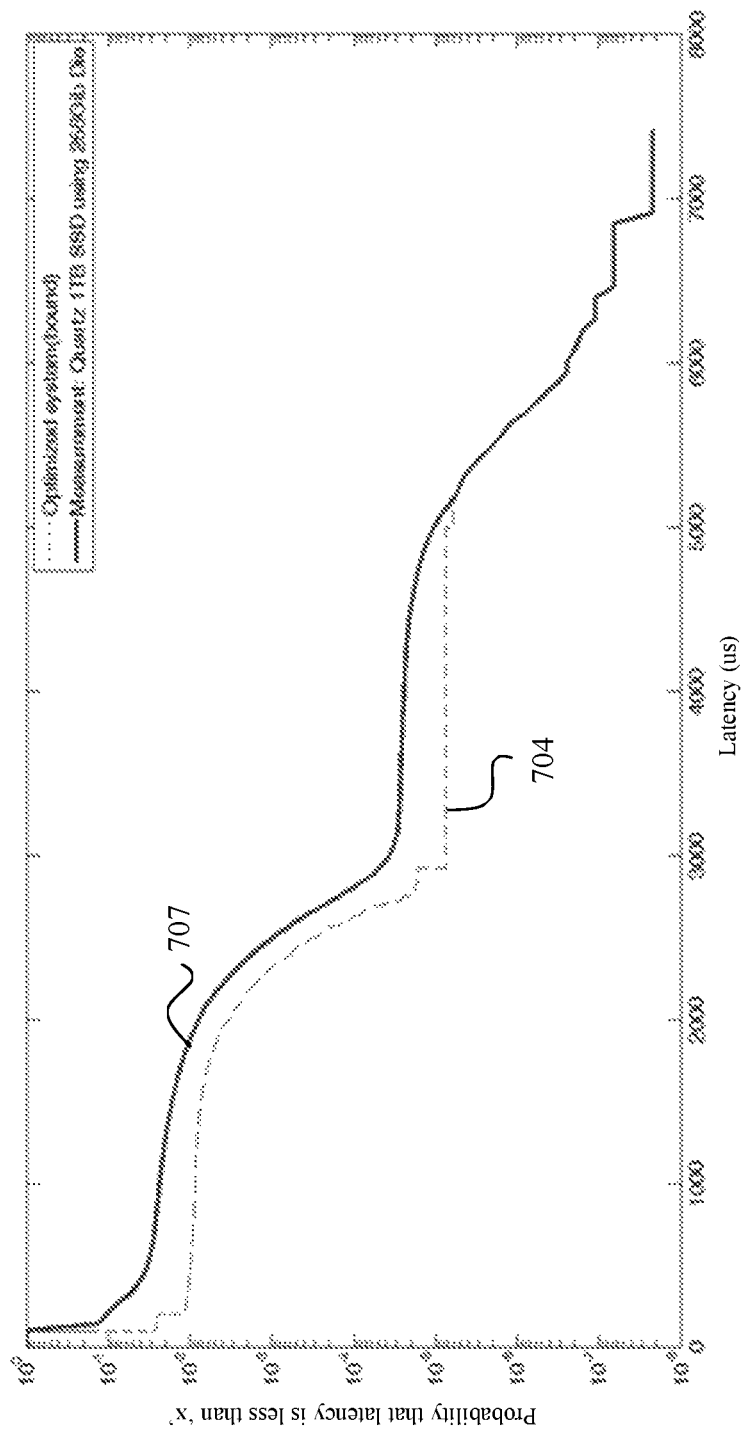
FIG. 7 is a performance plot illustrating the latency properties of a system that implements embodiments of the disclosed technology.

FIG. 7 illustrating the latency properties of a system that implements embodiments of the disclosed technology. This example, corresponding to a 50% read and 50% write workload, illustrates the QoS improvement (704) as compared to an existing system (707) that includes a 1 Terabyte (TB) SSD using a 256 GB die. As illustrated in FIG. 7, which plots the probability that the latency is less than a given latency (y-axis) vs the given latency (x-axis), the lower latency probability is consistently lower in embodiments of the disclosed technology.

Figure 8:
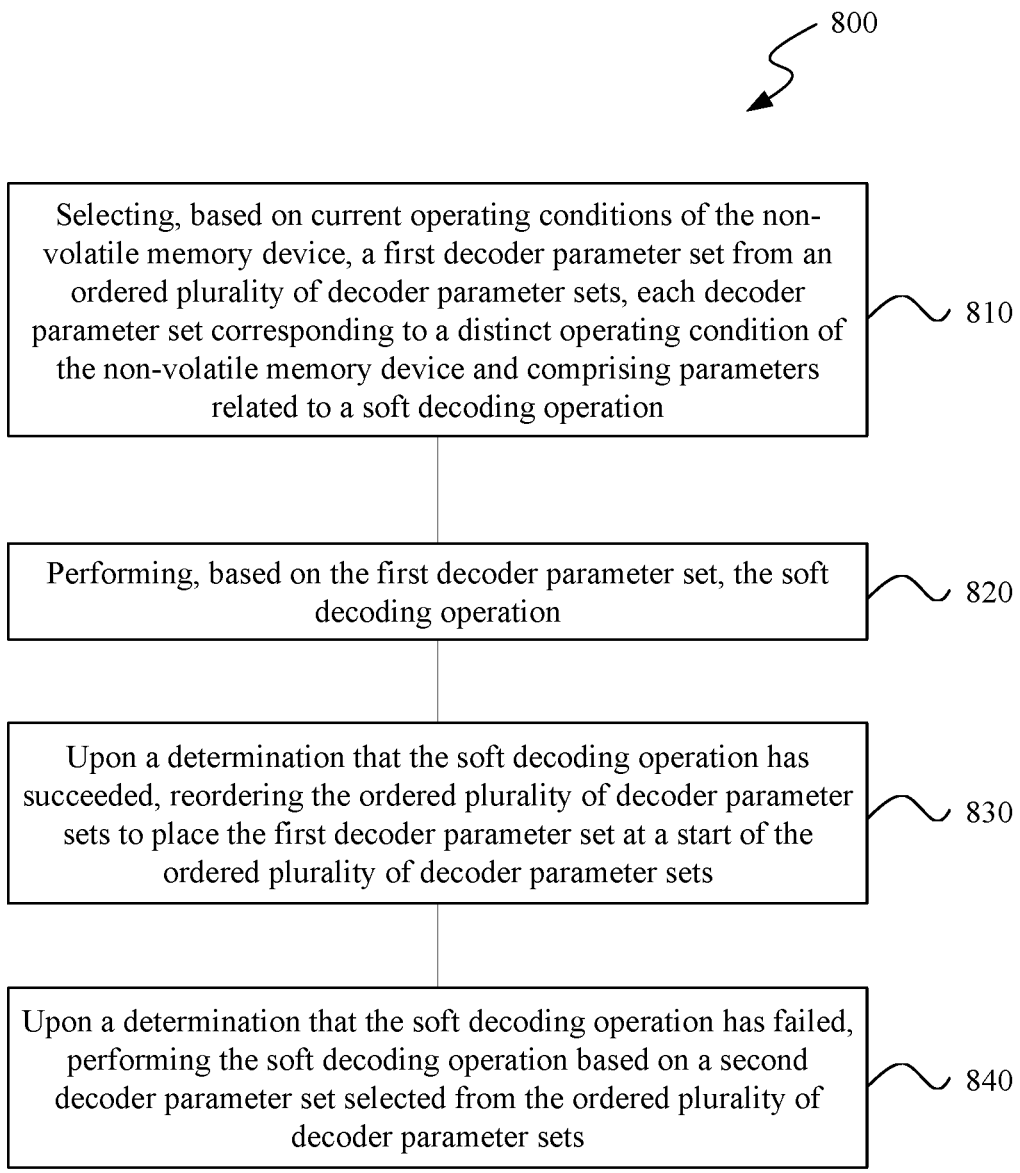
FIG. 8 illustrates a flowchart of another example method for improving the QoS of an adaptive soft decoder.

FIG. 8 illustrates a flowchart of a method 800 for improving the quality of service (QoS) of an adaptive soft decoder. The method 800 includes, at operation 810, selecting, based on current operating conditions of the non-volatile memory device, a first decoder parameter set from an ordered plurality of decoder parameter sets, each decoder parameter set corresponding to a distinct operating condition of the non-volatile memory device and comprising parameters related to a soft decoding operation.

The method 800 includes, at operation 820, performing, based on the first decoder parameter set, the soft decoding operation.

The method 800 includes, at operation 830, upon a determination that the soft decoding operation has succeeded, reordering the ordered plurality of decoder parameter sets to place the first decoder parameter set at a start of the ordered plurality of decoder parameter sets.

The method 800 includes, at operation 840, upon a determination that the soft decoding operation has failed, performing the soft decoding operation based on a second decoder parameter set selected from the ordered plurality of decoder parameter sets.

In some embodiments, the operating conditions comprise at least one of a number of program and erase cycles, a retention parameter, or a read disturbance parameter.

In some embodiments, each decoder parameter set comprises at least two of following parameters: a beta scale factor, an iteration control mechanism, an initial log likelihood ratio (LLR) bitwidth, an LLR dampening scale factor, or a checksum threshold.

In some embodiments, a size of the ordered plurality of decoder parameter sets is 16.

In some embodiments, an ordering of the ordered plurality of decoder parameter sets is based on a bit error rate (BER), a block error rate (BLER), or a codeword failure rate (CFR) for each decoder parameter set. In other embodiments, the ordering may be based on a latency metric or a number of read/write operations per second.

In some embodiments, the ordering is determined in a firmware component or a hardware component associated with the non-volatile memory device.

In some embodiments, the method 800 further includes the operation of performing, prior to the selecting, an offline optimization that generates the ordered plurality of decoder parameter sets based on an AWGN model of the non-volatile memory device or at least one dataset related to operating conditions of the non-volatile memory device.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving a quality of service of a decoder in a non-volatile memory device, comprising:
   selecting, by a controller module of the non-volatile memory device and based on current operating conditions of the non-volatile memory device, a first decoder parameter set from an ordered plurality of decoder parameter sets, each decoder parameter set corresponding to a distinct operating condition of the non-volatile memory device and comprising parameters related to a soft decoding operation;
   performing, by a decoder and based on the first decoder parameter set, the soft decoding operation;
   upon a determination that the soft decoding operation has succeeded, reordering an ordering of the ordered plurality of decoder parameter sets to place the first decoder parameter set at a start of the ordered plurality of decoder parameter sets; and
   upon a determination that the soft decoding operation has failed, performing the soft decoding operation based on a second decoder parameter set selected from the ordered plurality of decoder parameter sets.

2. The method of claim 1, wherein the operating conditions comprise at least one of a number of program and erase cycles, a retention parameter, or a read disturbance parameter.

3. The method of claim 1, wherein each decoder parameter set comprises at least two of following parameters:
   a beta scale factor,
   an iteration control mechanism,
   an initial log likelihood ratio (LLR) bitwidth,
   an LLR dampening scale factor, or
   a checksum threshold.

4. The method of claim 1, wherein a size of the ordered plurality of decoder parameter sets is 16.

5. The method of claim 1, wherein the ordering of the ordered plurality of decoder parameter sets is based on a bit error rate, a block error rate, or a codeword failure rate for each decoder parameter set.

6. The method of claim 5, wherein the ordering is determined in a firmware component or a hardware component associated with the non-volatile memory device.

7. The method of claim 1, further comprising:
   performing, prior to the selecting, an offline optimization that generates the ordered plurality of decoder parameter sets based on an additive white Gaussian noise (AWGN) model of the non-volatile memory device or at least one dataset related to operating conditions of the non-volatile memory device.

8. A system for improving a quality of service of a decoder in a non-volatile memory device, comprising:
   a processor and a memory including instructions stored thereupon, wherein the instructions upon execution by the processor cause the processor to:
   select, based on current operating conditions of the non-volatile memory device, a first decoder parameter set from an ordered plurality of decoder parameter sets, each decoder parameter set corresponding to a distinct operating condition of the non-volatile memory device and comprising parameters related to a soft decoding operation;
   perform, based on the first decoder parameter set, the soft decoding operation;
   upon a determination that the soft decoding operation has succeeded, reorder an ordering of the ordered plurality of decoder parameter sets to place the first decoder parameter set at a start of the ordered plurality of decoder parameter sets; and
   upon a determination that the soft decoding operation has failed, perform the soft decoding operation based on a second decoder parameter set selected from the ordered plurality of decoder parameter sets.

9. The system of claim 8, wherein the operating conditions comprise at least one of a number of program and erase cycles, a retention parameter, or a read disturbance parameter.

10. The system of claim 8, wherein each decoder parameter set comprises at least two of following parameters:
    a beta scale factor,
    an iteration control mechanism,
    an initial log likelihood ratio (LLR) bitwidth,
    an LLR dampening scale factor, or
    a checksum threshold.

11. The system of claim 8, wherein a size of the ordered plurality of decoder parameter sets is 16.

12. The system of claim 8, wherein the ordering of the ordered plurality of decoder parameter sets is based on a bit error rate, a block error rate, or a codeword failure rate for each decoder parameter set.

13. The system of claim 12, wherein the ordering is determined in a firmware component or a hardware component associated with the non-volatile memory device.

14. The system of claim 8, wherein the instructions upon execution by the processor further cause the processor to:
perform, prior to the selecting, an offline optimization that generates the ordered plurality of decoder parameter sets based on an additive white Gaussian noise (AWGN) model of the non-volatile memory device or at least one dataset related to operating conditions of the non-volatile memory device.

15. A non-transitory computer-readable storage medium having instructions stored thereupon for improving a quality of service of a decoder in a non-volatile memory device, comprising:
instructions for selecting, based on current operating conditions of the non-volatile memory device, a first decoder parameter set from an ordered plurality of decoder parameter sets, each decoder parameter set corresponding to a distinct operating condition of the non-volatile memory device and comprising parameters related to a soft decoding operation;
instructions for performing, based on the first decoder parameter set, the soft decoding operation;
instructions for reordering, upon a determination that the soft decoding operation has succeeded, an ordering of the ordered plurality of decoder parameter sets to place the first decoder parameter set at a start of the ordered plurality of decoder parameter sets; and
instructions for performing, upon a determination that the soft decoding operation has failed, the soft decoding operation based on a second decoder parameter set selected from the ordered plurality of decoder parameter sets.

16. The storage medium of claim 15, wherein the operating conditions comprise at least one of a number of program and erase cycles, a retention parameter, or a read disturbance parameter.

17. The storage medium of claim 15, wherein a size of the ordered plurality of decoder parameter sets is 16.

18. The storage medium of claim 15, wherein the ordering of the ordered plurality of decoder parameter sets is based on a bit error rate, a block error rate, or a codeword failure rate for each decoder parameter set.

19. The storage medium of claim 18, wherein the ordering is determined in a firmware component or a hardware component associated with the non-volatile memory device.

20. The storage medium of claim 15, further comprising:
instructions for performing, prior to the selecting, an offline optimization that generates the ordered plurality of decoder parameter sets based on an additive white Gaussian noise (AWGN) model of the non-volatile memory device or at least one dataset related to operating conditions of the non-volatile memory device.

* * * * *